United States Patent
Park et al.

(10) Patent No.: US 11,690,262 B2
(45) Date of Patent: Jun. 27, 2023

(54) DISPLAY APPARATUS

(71) Applicant: Samsung Display Co., Ltd., Yongin-si (KR)

(72) Inventors: Beomsoo Park, Yongin-si (KR); Seungchan Lee, Yongin-si (KR); Wangjo Lee, Yongin-si (KR); Jaebum Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 31 days.

(21) Appl. No.: 17/107,809

(22) Filed: Nov. 30, 2020

(65) Prior Publication Data

US 2021/0376036 A1    Dec. 2, 2021

(30) Foreign Application Priority Data

Jun. 1, 2020 (KR) .......................... 10-2020-0066062

(51) Int. Cl.
*H01L 27/32* (2006.01)

(52) U.S. Cl.
CPC .................. *H01L 27/3276* (2013.01)

(58) Field of Classification Search
CPC ............. H01L 27/3276; H01L 27/3244; H01L 27/3248; H01L 27/3262; H01L 27/124; H01L 27/1248; G09G 3/3258
See application file for complete search history.

(56) References Cited

U.S. PATENT DOCUMENTS

| | | | |
|---|---|---|---|
| 6,667,783 B2 | 12/2003 | Greene et al. | |
| 7,515,406 B2 | 4/2009 | Kee et al. | |
| 10,254,578 B2 | 4/2019 | Shin et al. | |
| 10,727,293 B2 | 7/2020 | Jeong et al. | |
| 2017/0330513 A1* | 11/2017 | Hong | H01L 27/3258 |
| 2018/0145127 A1* | 5/2018 | Shin | H01L 51/5253 |

FOREIGN PATENT DOCUMENTS

| KR | 10-1400284 B1 | 5/2014 |
|---|---|---|
| KR | 10-2015-0078593 A | 7/2015 |
| KR | 10-2017-0042421 A | 4/2017 |
| KR | 10-2019-0083392 A | 7/2019 |

\* cited by examiner

*Primary Examiner* — Mark W Regn
(74) *Attorney, Agent, or Firm* — Lewis Roca Rothgerber Christie LLP

(57) ABSTRACT

A display apparatus includes: a display area; a peripheral area on an outer portion of the display area; a substrate; a thin film transistor on the substrate and comprising a semiconductor layer and a gate electrode overlapping at least a portion of the semiconductor layer; a plurality of data lines in the display area and extending in a first direction; a plurality of input lines in the peripheral area; a plurality of connecting lines in the display area that electrically connect the plurality of data lines to the plurality of input lines; a power voltage line on the substrate and extending in the first direction; and an initialization voltage line on the substrate and extending in a second direction intersecting the first direction, wherein a part of each of the plurality of connecting lines overlaps at least one of the power voltage line or the initialization voltage line.

18 Claims, 9 Drawing Sheets

DISPLAY APPARATUS

CROSS-REFERENCE TO RELATED APPLICATION

The present application claims priority to and the benefit of Korean Patent Application No. 10-2020-0066062, filed on Jun. 1, 2020, in the Korean Intellectual Property Office, the entire disclosure of which is incorporated by reference herein.

BACKGROUND

1. Field

Aspects of one or more example embodiments relate to a display apparatus.

2. Description of Related Art

As the field of displays for visually expressing various electrical signals has rapidly developed, various display apparatuses having certain desirable characteristics such as a relatively small thickness, a relatively low weight, and relatively low power consumption, etc. have been introduced. Recently, there have been developments toward reducing a dead space (i.e., a non-display area) in a display apparatus and increasing the relatively size of the display area.

In general, in a display apparatus such as an organic light-emitting display apparatus, thin film transistors correspond to each (sub-)pixel in order to control luminance, etc. of each (sub-)pixel. Such thin film transistors are generally utilized to control luminance, etc. of corresponding (sub-) pixels according to a data signal transferred thereto. A data signal is transferred to each (sub-)pixel via a data line from a driver in a peripheral area that is on an outer portion of a display area.

The above information disclosed in this Background section is only for enhancement of understanding of the background and therefore the information discussed in this Background section does not necessarily constitute prior art.

SUMMARY

Aspects of one or more example embodiments relate to a display apparatus, and for example, to a display apparatus, in which a non-display area may be reduced and high quality images may be reproduced.

In a display apparatus according to the related art, a region in which a driver and other electrical components are located may have a relatively large area, or a region extending from the driver to a display area may have a relatively large area. Accordingly, an area of a dead space (e.g., an area outside of the display area) in which light-emitting devices are not arranged may be undesirably large.

Aspects of one or more example embodiments may include a display apparatus, in which an area of a dead space is relatively reduced and the visibility of wirings that are patterned in a display area may be prevented or reduced. However, the above technical characteristics are merely examples, and the scope of embodiments according to the present disclosure is not limited thereto.

Additional aspects will be set forth in part in the description which follows and, in part, will be more apparent from the description, or may be learned by practice of the presented example embodiments of the disclosure.

According to one or more example embodiments, a display apparatus includes: a display area; a peripheral area on an outer portion of the display area; a substrate; a thin film transistor on the substrate, the thin film transistor including a semiconductor layer and a gate electrode overlapping at least a portion of the semiconductor layer; a plurality of data lines in the display area, the plurality of data lines extending in a first direction; a plurality of input lines in the peripheral area; a plurality of connecting lines in the display area, the plurality of connecting lines electrically connecting the plurality of data lines to the plurality of input lines; a power voltage line on the substrate, the power voltage line extending in the first direction; and an initialization voltage line on the substrate, the initialization voltage line extending in a second direction intersecting the first direction, wherein a part in each of the plurality of connecting lines overlaps at least one of the power voltage line or the initialization voltage line.

According to some example embodiments, the display apparatus may further include a thin film transistor on the substrate, the thin film transistor including a semiconductor layer and a gate electrode overlapping at least a portion of the semiconductor layer, wherein the plurality of connecting lines may be between the substrate and the semiconductor layer.

According to some example embodiments, each of the plurality of connecting lines may include a first main body extending in the first direction and overlapping the first voltage line, and a second main body extending in the second direction and overlapping the second voltage line.

According to some example embodiments, each of the plurality of connecting lines may further include first branch portions extending from the first main body in the second direction, and second branch portions extending from the second main body in the first direction.

According to some example embodiments, the first branch portions may overlap the initialization voltage line, and the second branch portions may overlap the power voltage line.

According to some example embodiments, one of the first branch portions may have an extension length that is different from an extension length of another first branch portion, and one of the second branch portions may have an extension length that is different from an extension length of another second branch portion.

According to some example embodiments, the plurality of connecting lines may include a first connecting line and a second connecting line that are adjacent to each other, each of the first connecting line and the second connecting line may include a first main body extending in the first direction, first branch portions extending from the first main body in the second direction, a second main body connected to the first main body, the second main body extending in the second direction, and second branch portions extending from the second main body in the first direction, the first branch portions of the first connecting line and the first branch portions of the second connecting line may respectively face each other and may be separated from each other with a plurality of first gaps therebetween, and the second branch portions of the first connecting line and the second branch portions of the second connecting line may respectively face each other and may be separated from each other with a plurality of second gaps therebetween.

According to some example embodiments, the plurality of first gaps and the plurality of second gaps may be randomly provided between the first connecting line and the second connecting line.

According to some example embodiments, the plurality of data lines and the plurality of connecting lines may be at different layers from each other.

According to some example embodiments, the initialization voltage line may be at the same layer as the gate electrode.

According to some example embodiments, the display apparatus may further include an insulating layer covering the thin film transistor, wherein the power voltage may be on the insulating layer.

According to some example embodiments, the plurality of connecting lines may include at least one of aluminum (Al), titanium (Ti), or titanium nitride (TiN).

According to one or more example embodiments, a display apparatus includes: a display area; a peripheral area on an outer portion of the display area; a substrate; a plurality of data lines on the substrate, the plurality of data lines extending in the display area in a first direction; a pad portion in the peripheral area, the pad portion providing electrical signals; a plurality of input lines in the peripheral area, the plurality of input lines being electrically connected to the pad portion; a plurality of connecting lines in the display area, the plurality of connecting lines electrically connecting the plurality of data lines to the plurality of input lines; a first voltage line on the substrate, the first voltage line extending in the first direction; and a second voltage line on the substrate, the second voltage line extending in a second direction intersecting the first direction, wherein a part in each of the plurality of connecting lines overlaps at least one of the first voltage line or the second voltage line.

According to some example embodiments, the plurality of connecting lines may be between the substrate and the semiconductor layer.

According to some example embodiments, each of the plurality of connecting lines may further include a first main body extending in the first direction and overlapping the first voltage line, and a second main body extending in the second direction and overlapping the second voltage line.

According to some example embodiments, each of the plurality of connecting lines may further include first branch portions extending from the first main body in the second direction, and second branch portions extending from the second main body in the first direction.

According to some example embodiments, the first branch portions may overlap the second voltage line, and the second branch portions may overlap the first voltage line.

According to some example embodiments, the plurality of connecting lines may include a first connecting line and a second connecting line that are adjacent to each other, each of the first connecting line and the second connecting line may include a first main body extending in the first direction, first branch portions extending from the first main body in the second direction, a second main body connected to the first main body, the second main body extending in the second direction, and second branch portions extending from the second main body in the first direction, the first branch portions of the first connecting line and the first branch portions of the second connecting line may respectively face each other and may be separated from each other with a plurality of first gaps therebetween, and the second branch portions of the first connecting line and the second branch portions of the second connecting line may respectively face each other and may be separated from each other with a plurality of second gaps therebetween.

According to some example embodiments, the plurality of first gaps and the plurality of second gaps may be randomly provided between the first connecting line and the second connecting line.

According to some example embodiments, the plurality of connecting lines may include aluminum (Al) and titanium (Ti) or titanium nitride (TiN).

Other aspects, features and characteristics of some example embodiments according to the present disclosure will become better understood through the accompanying drawings, the claims and the detailed description.

Such general and specific aspects of the disclosure may be performed using systems, methods, computer-readable storage mediums, and/or combinations thereof.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
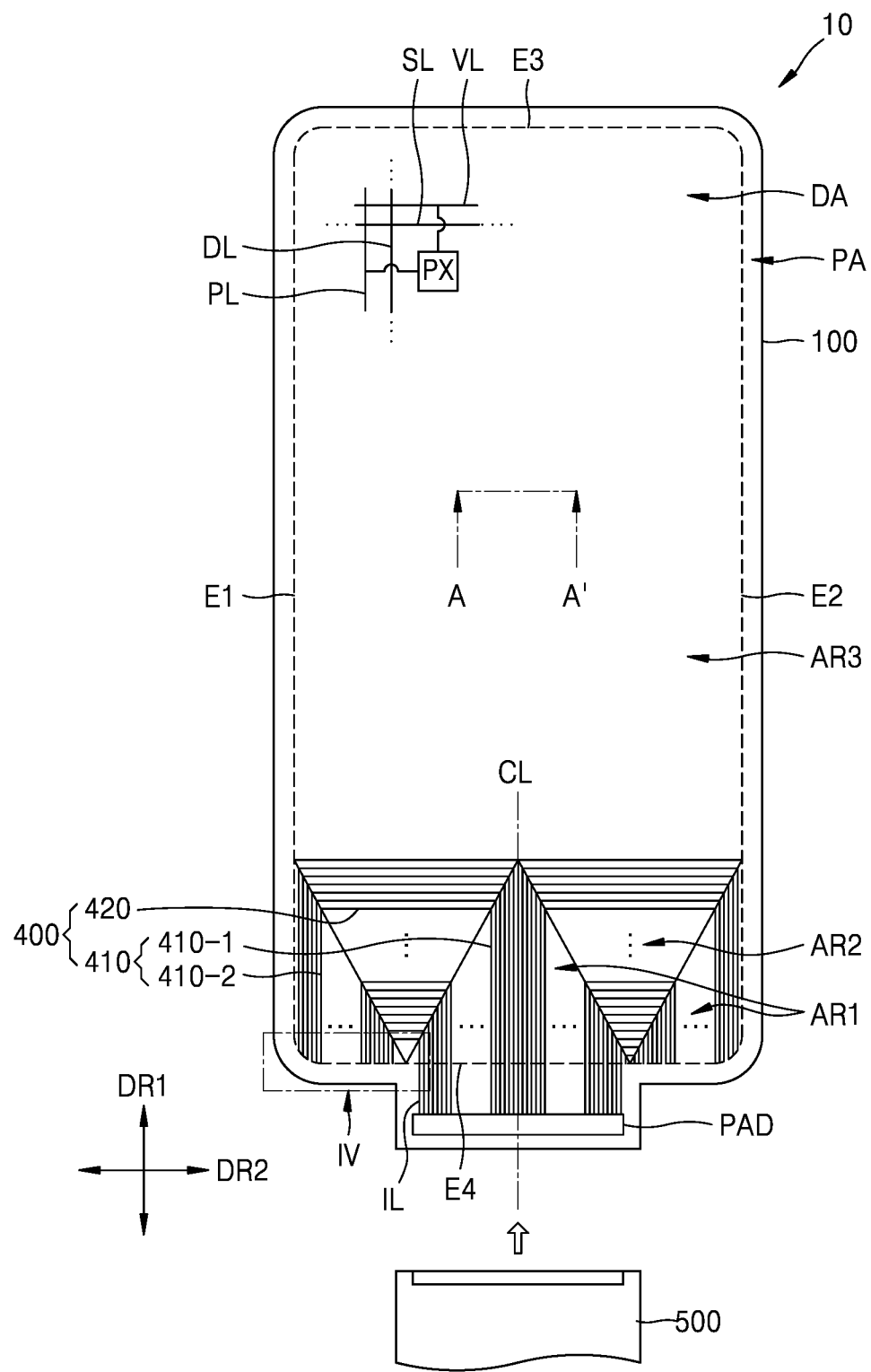
FIG. 1 is a plan view of a display apparatus according to some example embodiments.

As embodiments according to the present disclosure allows for various changes and numerous embodiments, example embodiments will be illustrated in the drawings and described in more detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a plan view of a display apparatus 10 according to some example embodiments.

Referring to FIG. 1, the display apparatus 10 according to some example embodiments may include a display area DA capable of displaying images (e.g., static or video images), and a peripheral area PA on an outer side of (e.g., outside of, or outside a footprint of) the display area DA. The display apparatus 10 may provide or display images via arrays of a plurality of pixels PX in the display area DA. The peripheral area PA does not provide images and may partially or entirely surround the display area DA. Thus, the peripheral area PA may be a bezel area.

Edges of the display area DA may entirely have a shape similar to a rectangle or a square. For example, the display area DA may include a first edge E1 and a second edge E2 facing each other (e.g., on opposite sides of a rectangle), and a third edge E3 and a fourth edge E4 facing each other (e.g., on opposite sides of the rectangle) between the first edge E1 and the second edge E2. Embodiments according to the present disclosure are not limited to the display apparatus 10 and/or the display area DA having a rectangular or square shape, and the display apparatus and/or the display area DA may have any suitable shape according to the design of the display apparatus 10. According to some example embodiments, a pad portion PAD may be adjacent to, for example, the fourth edge E4.

The display area DA may include the plurality of pixels PX and pixel circuits respectively corresponding to the plurality of pixels PX, and wirings that may apply electrical signals respectively to the pixel circuits. The pixel circuit may include thin film transistors, a storage capacitor, etc. The pixel PX may be defined as an emission area from which light is emitted by a light-emitting device electrically connected to the pixel circuit. The light-emitting device may include, for example, an organic light-emitting diode OLED. The plurality of pixels PX may include first pixels emitting first color light, second pixels emitting second color light, and third pixels emitting third color light. For example, the first pixel include a red pixel, the second pixel may include a green pixel, and the third pixel may include a blue pixel.

Wirings may include scan lines SL, data lines DL, initialization voltage lines VL, driving voltage lines PL, etc. The scan lines SL may be provided in, for example, a plurality of rows, and may be configured to transfer scan signals to corresponding ones of the pixel circuits, the data lines DL may be provided in, for example, a plurality of columns, and may be configured to transfer data signals to corresponding ones of the pixels PX, and the plurality of pixels PX may be at intersections between the scan lines SL and the data lines DL. Also, the initialization voltage lines VL and the driving voltage lines PL may respectively apply a constant voltage, e.g., an initialization voltage Vint or a driving voltage ELVDD, to the pixel circuits.

Also, a plurality of connecting lines 400 for transferring electrical signals from the pad portion PAD to the wirings connected to the pixel circuits may be in the display area DA. For example, the plurality of connecting lines 400 are electrically connected to a plurality of input lines IL extending from the pad portion PAD to receive the data signals supplied from the pad portion PAD, and are electrically connected to the data lines DL for transferring the data signals to the data lines DL. According to some example embodiments, the plurality of connecting lines 400 are at a different layer from those of the input lines IL and the data lines DL, and may be electrically connected to the input lines IL and the data lines DL via contact holes.

In addition, because a length of the fourth edge E4 of the display area DA, which is adjacent to the pad portion PAD, is greater than that of the pad portion PAD, the display apparatus 10 may include fan-out lines including the plurality of input lines IL and the plurality of connecting lines 400. The plurality of connecting lines 400 may correspond to the plurality of input line IL extending from the pad portion PAD and to the data lines DL in the display area DA. For example, the plurality of connecting lines 400 may extend from a center of the fourth edge E4 in a first direction DR1, and then, may be bent in a second direction to extend towards the first edge E1 or the second edge E2. After that, the plurality of connecting lines 400 may be bent again in the first direction DR1 to extend towards opposite ends of the fourth edge E4. The plurality of connecting lines 400 may each have a U-shape.

In other words, the plurality of connecting lines 400 may each include a first main body 410 extending in the first direction DR1 and a second main body 420 extending in a second direction DR2. The plurality of connecting lines 400 may each include a 1-1st main body 410-1 extending from a center of a side (e.g., fourth edge E4) of the display area DA in the first direction DR1, a 1-2nd main body 410-2 extending from one of opposite ends of one side (e.g., fourth edge E4) of the display area DA in the first direction DR1, and the second main body 420 extending in the second direction DR2 intersecting the first direction DR1 and connecting the 1-1st main body 410-1 to the 1-2nd main body 410-2. Hereinafter, the 1-1st main body 410-1 and the 1-2nd main body 410-2 may be collectively referred to as the first main body 410.

Based on a virtual center line CL located at a center of the display apparatus 10 and extending in the first direction DR1, the plurality of connecting lines 400 at a left side of the center line CL and the plurality of connecting lines 400 at a right side of the center line CL may be symmetrical with each other.

Through the above structure, the data signal supplied through the center portion of the fourth edge E4 of the display area DA may be transferred to the data lines DL at opposite sides of the fourth edge E4 in the display area DA. Because the plurality of connecting lines 400 are not in the peripheral area PA, but in the display area DA, an area of the peripheral area PA may be reduced and a dead space of the display apparatus 10 may be reduced.

The display area DA may be partitioned as a plurality of regions based on a direction in which the plurality of connecting lines 400 extend. For example, the display area DA may include a first area AR1, in which the plurality of connecting lines 400 extend in the first direction DR1, a second region AR2 in which the plurality of connecting lines 400 extend in the second direction DR2, and a third region AR3 except for the first and second regions AR1 and AR2. The 1-1st main bodies 410-1 and the 1-2nd main bodies 410-2 of the plurality of connecting lines 400 are in the first region AR1, and the second main bodies 420 of the plurality of connecting lines 400 may be in the second region AR2.

There may be a plurality of first regions AR1 and a plurality of second regions AR2, which may each have a triangular shape. For example, in the first region AR1 at the center of the display apparatus 10, extension lengths of the 1-1st main bodies 410-1 may be gradually reduced from the center line CL towards the first edge E1 or the second edge E2. Accordingly, the first area AR1 may entirely have a triangular shape. In the second regions AR2 at opposite sides of the first region AR1, the second main bodies 420 in the second region AR2 extend from the 1-1st main bodies 410-1 in the second direction DR2, and thus, extension lengths of the second main bodies 420 may be gradually reduced towards the fourth edge E4. Accordingly, the second regions AR2 may each have an inverted triangular shape. In each of the first regions AR1 at outer sides of the second regions AR2, the 1-2nd main bodies 410-2 extend from the second main bodies 420 in the first direction DR1, the extension lengths of the 1-2nd main bodies 410-2 may be increased towards the first edge E1 or the second edge E2. Accordingly, the first regions AR1 at the outer sides of the second regions AR2 may have triangular shapes.

Because the plurality of connecting lines 400 extend in different directions in the first regions AR1 and the second regions AR2, reflective characteristics of the external light from the first region AR1 and the second region AR2 may be different from each other, and accordingly, the first regions AR1 and the second regions AR2 may be differently visible to the user. To prevent this, the plurality of connecting lines 400 may include a plurality of branch portions 411 and 412 (see, e.g., FIG. 6A) extending in directions perpendicular to the directions in which the first and second main bodies 410 and 420 extend. As such, the first regions AR1 and the second regions AR2 may include similar patterns to each other, and thus, the difference between the reflective characteristics of the first and second regions AR1 and AR2 may be reduced. This will be described in detail below with reference to FIG. 6A.

In addition, the peripheral area PA may surround the display area DA. The peripheral area PA does not include the pixels PX, and may include drivers, etc. for providing the pixel circuits with electrical signals or electric power. Also, the pad portion PAD is in the peripheral area PA, and the peripheral area PA may include an integrated circuit for driving the display apparatus 10. The integrated circuit may be a data driving integrated circuit for generating a data signal, but one or more embodiments are not limited thereto. The pad portion PAD may be mounted on the peripheral area PA of the display apparatus 10.

A printed circuit board 500, etc. may be attached to an end portion of the peripheral area PA. The printed circuit board 500, etc. may not be covered by an insulating layer, but may be electrically connected to the pad portion PAD via terminals on an exposed part of the substrate 100. The printed circuit board 500 may be configured to transfer a signal or a power from a controller to the display apparatus 10. A control signal generated by the controller may be respectively transferred to the pixel circuits via the printed circuit board 500 and the pad portion PAD.

In addition, FIG. 1 is a plan view showing the substrate 100 during processes of manufacturing the display apparatus 10. In a final product of the display apparatus 10 or an electronic device such as a smartphone including the display apparatus 10, the substrate 100 may be partially bent in order to reduce an area of the peripheral area PA recognized by a user. To this end, the substrate 100 may include various materials that are flexible or bendable.

Hereinafter, the display apparatus 10 includes an organic light-emitting diode OLED as a light-emitting device, but the display apparatus 10 according to one or more embodiments is not limited thereto. According to some example embodiments, the display apparatus 10 may include an inorganic light-emitting display (or an inorganic EL display apparatus) including an inorganic material such as a micro LED, or a quantum dot light-emitting display apparatus. For example, an emission layer of a light-emitting device included in the display apparatus 10 may include an organic material, an inorganic material, quantum dots, an organic material and quantum dots, or an inorganic material and quantum dots.

Figure 2:
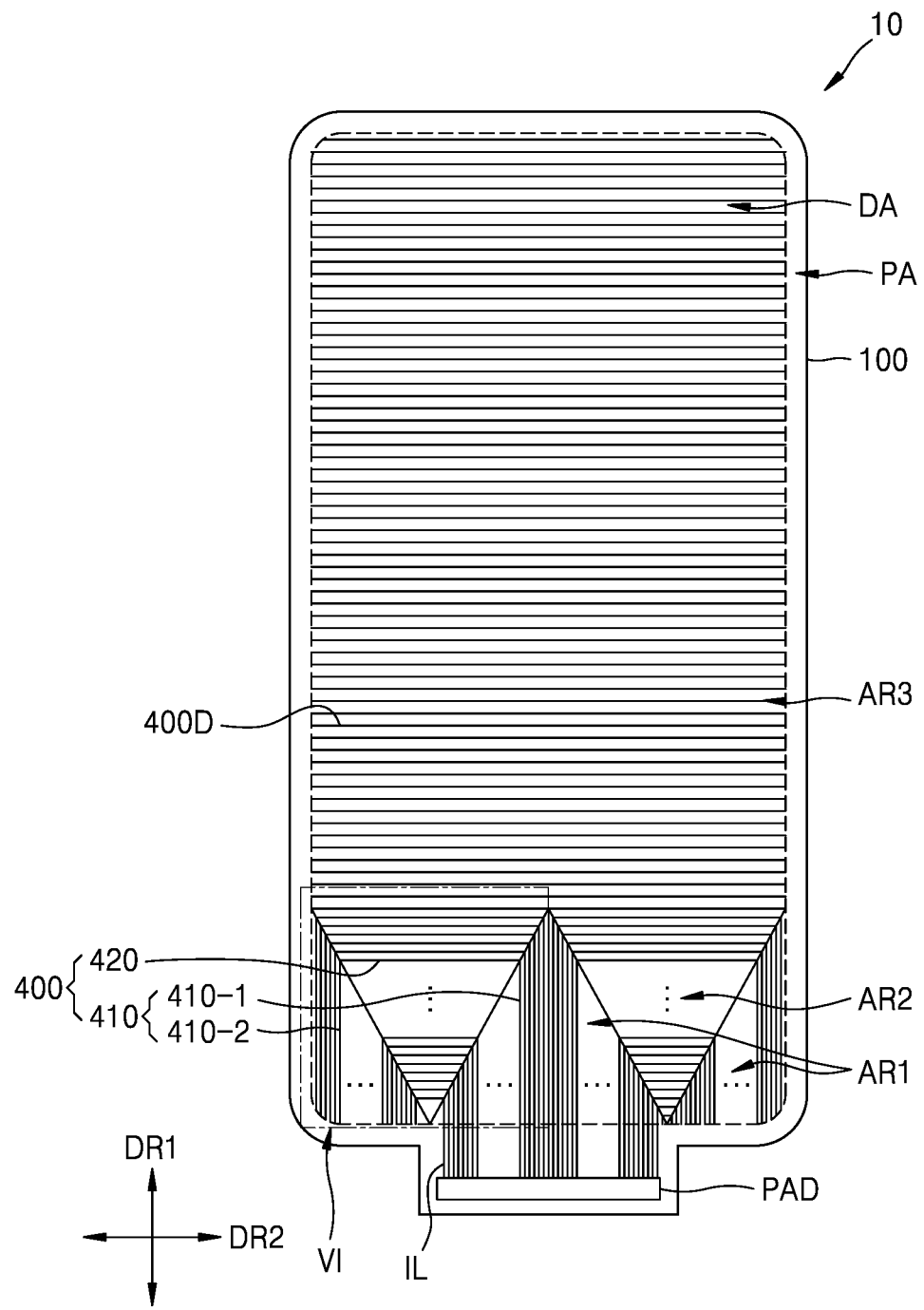
FIG. 2 is a plan view of a display apparatus according to some example embodiments.

FIG. 2 is a plan view of the display apparatus 10 according to some example embodiments. Descriptions about components that are the same as or similar to those described above with reference to FIG. 1 will be omitted.

Referring to FIG. 2, dummy connecting lines 400D extending straightly in the second direction DR2 may be in the third region AR3. When the plurality of connecting lines 400 are only in the first and second regions AR1 and AR2 of the display area DA and not in the third region AR3, a difference between reflecting conditions may increase according to the regions, and the plurality of connecting lines 400 may be visible. To prevent this, the dummy connecting lines 400D are in the third region AR3 to reduce the difference between the reflecting conditions of respective regions and to reduce a probability of recognizing the plurality of connecting lines 400. The dummy connecting lines 400D may not perform electrical connection among the components.

Figure 3:
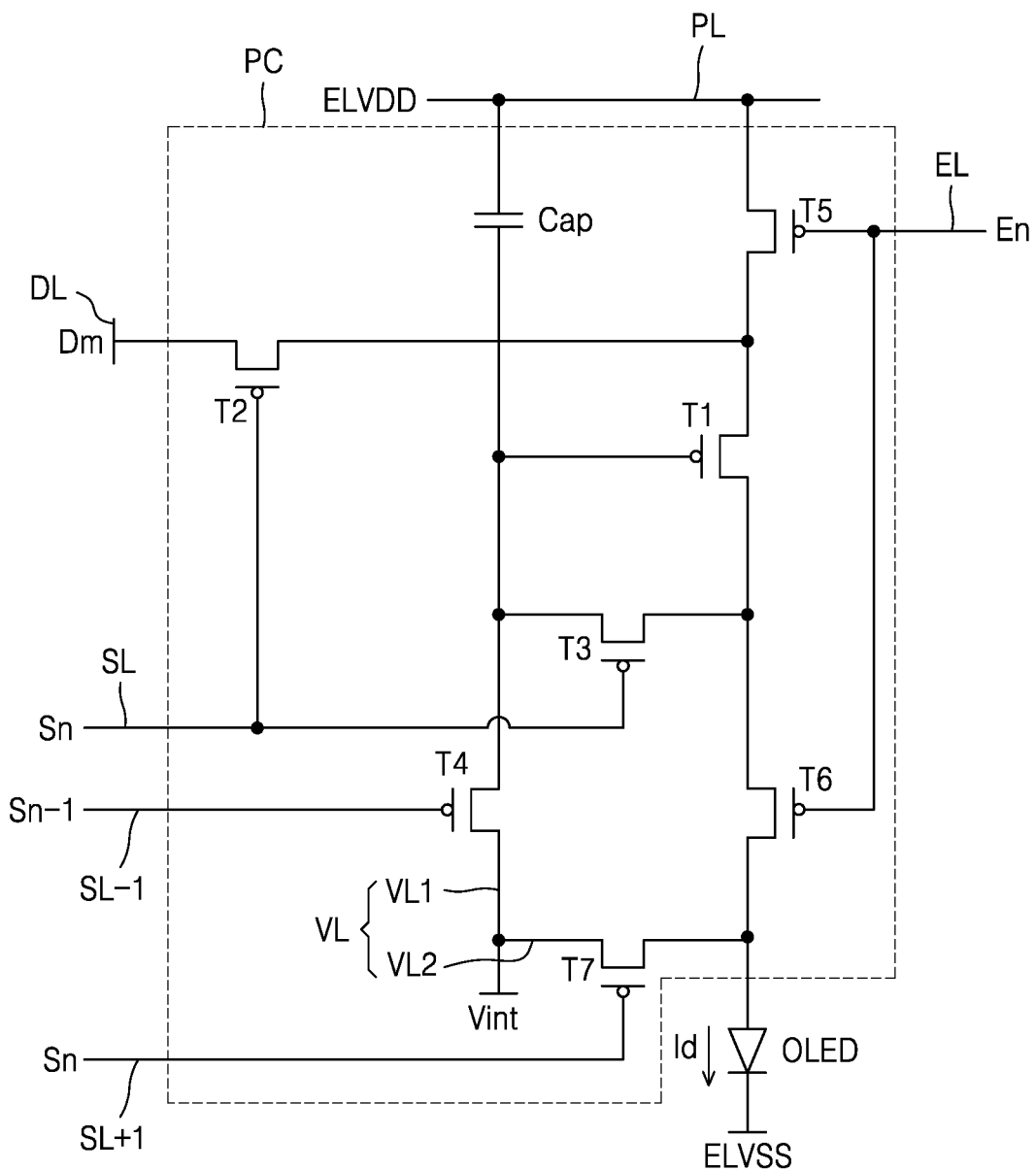
FIG. 3 is an equivalent circuit diagram of one pixel circuit in a display apparatus according to some example embodiments.

FIG. 3 is an equivalent circuit diagram of one pixel circuit in the display apparatus 10 according to some example embodiments.

Referring to FIG. 3, the display apparatus 10 includes a pixel circuit PC including a plurality of thin film transistors T1 to T7 and a storage capacitor Cap. In addition, the display apparatus 10 may include an organic light-emitting diode OLED as a light-emitting element, wherein the organic light-emitting diode OLED emits light by receiving a driving voltage through the pixel circuit PC.

The pixel circuit PC may include the plurality of thin film transistors and the storage capacitor. According to some example embodiments, the thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7, as shown in FIG. 3.

A gate electrode of the driving thin film transistor T1 is connected to an electrode of the storage capacitor Cap, one of a source electrode and a drain electrode of the driving thin film transistor T1 is connected to a driving voltage line PL via the operation control thin film transistor T5, and the other of the source electrode and the drain electrode of the driving thin film transistor T1 is electrically connected to a pixel electrode of the organic light-emitting diode OLED via the emission control thin film transistor T6. The driving thin film transistor T1 receives a data signal Dm according to a switching operation of the switching thin film transistor T2 and supplies a driving current Id to the organic light-emitting diode OLED.

A gate electrode of the switching thin film transistor T2 is connected to a first scan line SL, one of a source electrode and a drain electrode of the switching thin film transistor T2 is connected to a data line DL, and the other of the source electrode and the drain electrode of the switching thin film transistor T2 is connected to the driving thin film transistor T1 and at the same time connected to the driving voltage line PL via the operation control thin film transistor T5. The switching thin film transistor T2 is turned on according to a scan signal Sn transmitted via the first scan line SL to perform a switching operation, in which the data signal Dm transferred to the data line DL is transferred to the driving thin film transistor T1.

A gate electrode of the compensation thin film transistor T3 is connected to the first scan line SL, one of a source electrode and a drain electrode of the compensation thin film transistor T3 is connected to the driving thin film transistor T1 and at the same time connected to a pixel electrode of the organic light-emitting diode OLED via the emission control thin film transistor T6, and the other of the source electrode and the drain electrode of the compensation thin film transistor T3 is connected to the electrode of the storage capacitor Cap, the first initialization thin film transistor T4, and the driving thin film transistor T1. The compensation thin film transistor T3 is turned on according to the scan signal Sn transferred through the first scan line SL to electrically connect the gate electrode G1 of the driving thin film transistor T1 to one of the source electrode and the drain electrode (e.g., the drain electrode) of the driving thin film transistor T1 to each other to diode-connect the driving thin film transistor T1.

A gate electrode of the first initialization thin film transistor T4 is connected to the second scan line SL−1, one of a source electrode and a drain electrode of the first initialization thin film transistor T4 is connected to a first initialization voltage line VL1 of the initialization voltage lines VL, and the other of the source electrode and the drain electrode of the first initialization thin film transistor T4 is connected to the electrode of the storage capacitor Cap, the compensation thin film transistor T3, and the driving thin film transistor T1. The first initialization TFT T4 is turned on according to a previous scan signal Sn-1 transferred through the second scan line SL−1 to transfer an initialization voltage Vint to the gate electrode of the driving thin film transistor T1 and perform an initialization operation for initializing a voltage at the gate electrode of the driving thin film transistor T1.

A gate electrode of the operation control thin film transistor T5 is connected to an emission control line EL, one of a source electrode and a drain electrode of the operation control thin film transistor T5 is connected to the driving voltage line PL, and the other of the source electrode and the drain electrode of the operation control thin film transistor T5 is connected to the driving thin film transistor T1 and the switching thin film transistor T2.

A gate electrode of the emission control thin film transistor T6 is connected to the emission control line EL, one of a source electrode and a drain electrode of the emission control thin film transistor T6 is connected to the driving thin film transistor T1 and a compensation source electrode S3 of the compensation thin film transistor T3, and the other of the source electrode and the drain electrode of the emission control thin film transistor T6 is electrically connected to the second initialization thin film transistor T7 and the pixel electrode of the organic light-emitting diode OLED.

The operation control thin film transistor T5 and the emission control thin film transistor T6 are simultaneously (or concurrently) turned on according to an emission control signal En transferred through the emission control line EL to transfer a driving voltage ELVDD to the organic light-emitting diode OLED and to allow the driving current Id to flow in the organic light-emitting diode OLED.

The gate electrode of the second initialization thin film transistor T7 may be connected to a third scan line SL+1 of a pixel that is in a next row of the corresponding pixel PX. Also, one of the source electrode and the drain electrode of the second initialization thin film transistor T7 is connected to the emission control thin film transistor T6 and the pixel electrode of the organic light-emitting diode OLED, and the other between the source electrode and the drain electrode of the second initialization thin film transistor T7 is connected to a second initialization voltage line VL2 of the initialization voltage lines VL.

In addition, because the first scan line SL and the third scan line SL+1 are electrically connected to each other, a same scan signal Sn may be applied. Therefore, the second initialization thin film transistor T7 is turned on according to the scan signal Sn transferred through the third scan line SL+1 and performs an operation of initializing the pixel electrode of the organic light-emitting diode OLED.

In another example, the first initialization thin film transistor T4 and the second initialization thin film transistor T7 may be connected together to the second scan line SL−1.

One electrode of the storage capacitor Cap is connected to the driving voltage line PL and an opposite electrode of the organic light-emitting diode OLED is connected to a common voltage ELVSS. Accordingly, the organic light-emitting diode OLED emits light by receiving the driving current Id from the driving thin film transistor T1 to display images.

FIG. 3 shows that the pixel circuit PC includes seven thin film transistors T1 to T7 and one storage capacitor Cap, but one or more embodiments are not limited thereto. The number of electrical components including, for example, thin film transistors and the number of storage capacitors may vary depending on a design of the pixel circuit PC.

Figure 4A:
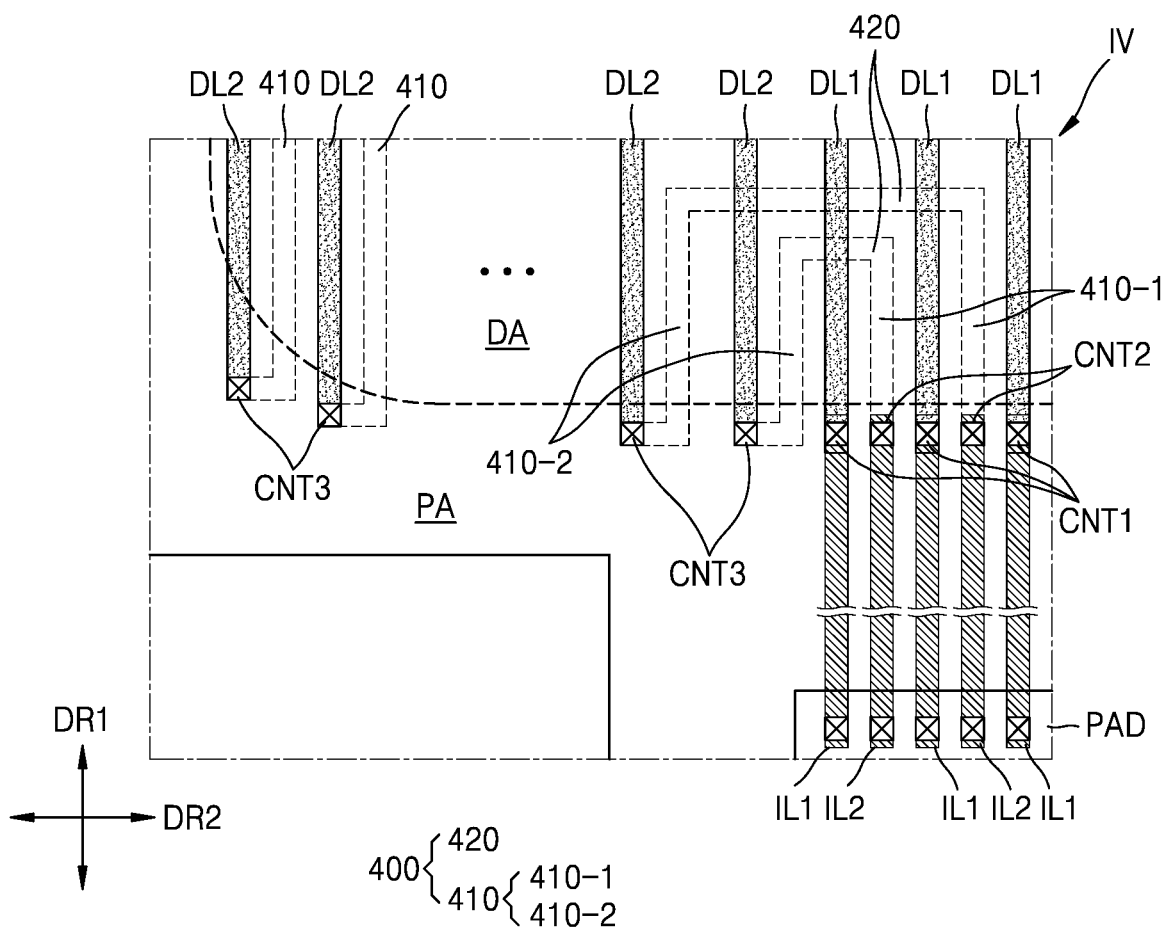
FIGS. 4A and 4B are plan views showing an enlarged view of the region IV in the display apparatus of FIG. 1.
Figure 4B:
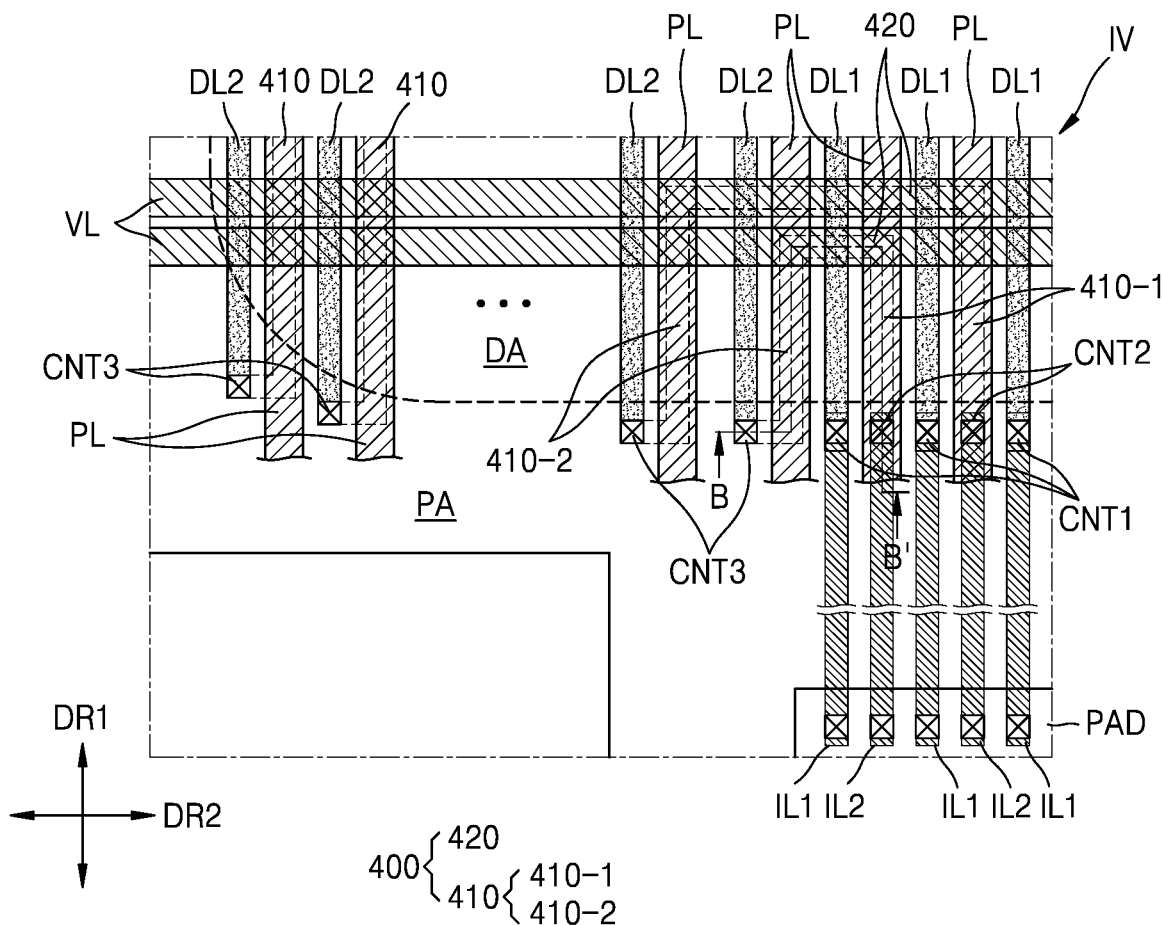

FIGS. 4A and 4B are plan views showing an enlarged view of a portion IV in the display apparatus 10 of FIG. 1.

Various electrical signals may be applied to the display area DA. For example, data signals, etc. for adjusting brightness of each pixel may be applied to the display area DA, and to do this, the display apparatus 10 may include a plurality of data lines DL that are separated from one another in parallel with one another. Referring to FIG. 4A, the plurality of data lines DL may extend from the peripheral area PA in the first direction DR1 towards the display area DA.

In order to input the data signals to the plurality of data lines DL, a plurality of input lines IL separated from one another may be in the peripheral area PA. The plurality of input lines IL may be electrically connected to the plurality of data lines DL, respectively. From among the plurality of input lines IL, first input lines IL1 may be directly connected to the first data lines DL1 from among the plurality of data lines DL, and second input lines IL2 may be indirectly connected to second data lines DL2 from among the plurality of data lines DL via the plurality of connecting lines 400.

For example, the plurality of input lines IL and the plurality of data lines DL may be at different layers from each other, and at least one insulating layer may be therebetween. In this case, the first input lines IL1 may be respectively connected to the first data lines DL1 via a first contact hole CNT1 in the at least one insulating layer. The first contact hole CNT1 may be in the peripheral area PA.

The plurality of input lines IL and the plurality of connecting lines 400 may be at different layers from each other with at least one insulating layer therebetween. Also, the plurality of connecting lines 400 and the plurality of data lines DL may be at different layers from each other with at least one insulating layer therebetween. As such, because the plurality of connecting lines 400 are at the different layer from those of the plurality of input lines IL and the plurality of data lines DL, the plurality of connecting lines 400 may connect the second input lines IL2 to the second data lines DL2 while passing through the display area DA.

The 1-1st main bodies 410-1 of the plurality of connecting lines 400 may be connected to the second input lines IL2 at end portions thereof via second contact holes CNT2. The second contact hole CNT2 may be in the peripheral area PA. The 1-1st main bodies 410-1 extend in the first direction DR1, and may be respectively connected to the second main bodies 420 of the plurality of connecting lines 400 extending in the second direction DR2. The second main bodies 420 may intersect with the data lines DL on a plane. The second main bodies 420 may be respectively connected to the 1-2nd main bodies 410-2 of the plurality of connecting lines 400 extending in the first direction DR1. The 1-2nd main bodies 410-2 may be respectively connected to the second data lines DL2 via third contact holes CNT3, and to do this, the 1-2nd main bodies 410-2 may include protrusions at end portions thereof in the second direction DR2. The third contact holes CNT3 may be on the protrusions or may be in the peripheral area PA. The 1-2nd main bodies 410-2 may not overlap the second data lines DL2. The 1-1st main bodies 410-1, the second main bodies 420, and the 1-2nd main bodies 410-2 of the plurality of connecting lines 400 may be integrally provided at the same layer and may include the same material.

According to the above structure, the plurality of input lines IL may not need to be directly connected to the data lines DL in the peripheral area PA, and some of the plurality of input lines IL may be electrically connected to some of the plurality of data lines DL after passing through the display area DA. Thus, an area of the peripheral area PA may be reduced. Therefore, the dead space of the display apparatus 10 may be reduced.

Referring to FIG. 4B, the display apparatus 10 may include the driving voltage lines PL for providing the pixel circuits PC (see, e.g., FIG. 3) with the driving voltage ELVDD (see, e.g., FIG. 3) and the initialization voltage lines VL for providing the pixel circuits PC with the initialization voltage Vint (see, e.g., FIG. 3).

For example, the driving voltage line PL extends in the first direction DR1, and the initialization voltage line VL may extend in the second direction DR2 intersecting the first direction DR1. The driving voltage line PL and the initialization voltage line VL may be at different layers from each other, and thus may be insulated from each other.

The driving voltage line PL and/or the initialization voltage line VL may overlap the plurality of connecting lines 400 above the plurality of connecting lines 400. That is, a part in each of the plurality of connecting lines 400 may overlap at least one of the driving voltage line PL or the initialization voltage line VL. For example, the driving voltage lines PL may overlap the first main bodies 410 extending in the first direction DR1 and the initialization voltage lines VL may overlap the second main bodies 420 extending in the second direction DR2 in the plurality of connecting lines 400. As described above, because the driving voltage lines PL and the initialization voltage lines PL overlap the plurality of connecting lines 400 above the connecting lines 400, patterns of the plurality of connecting lines 400 visible to users may be reduced.

Figure 5:
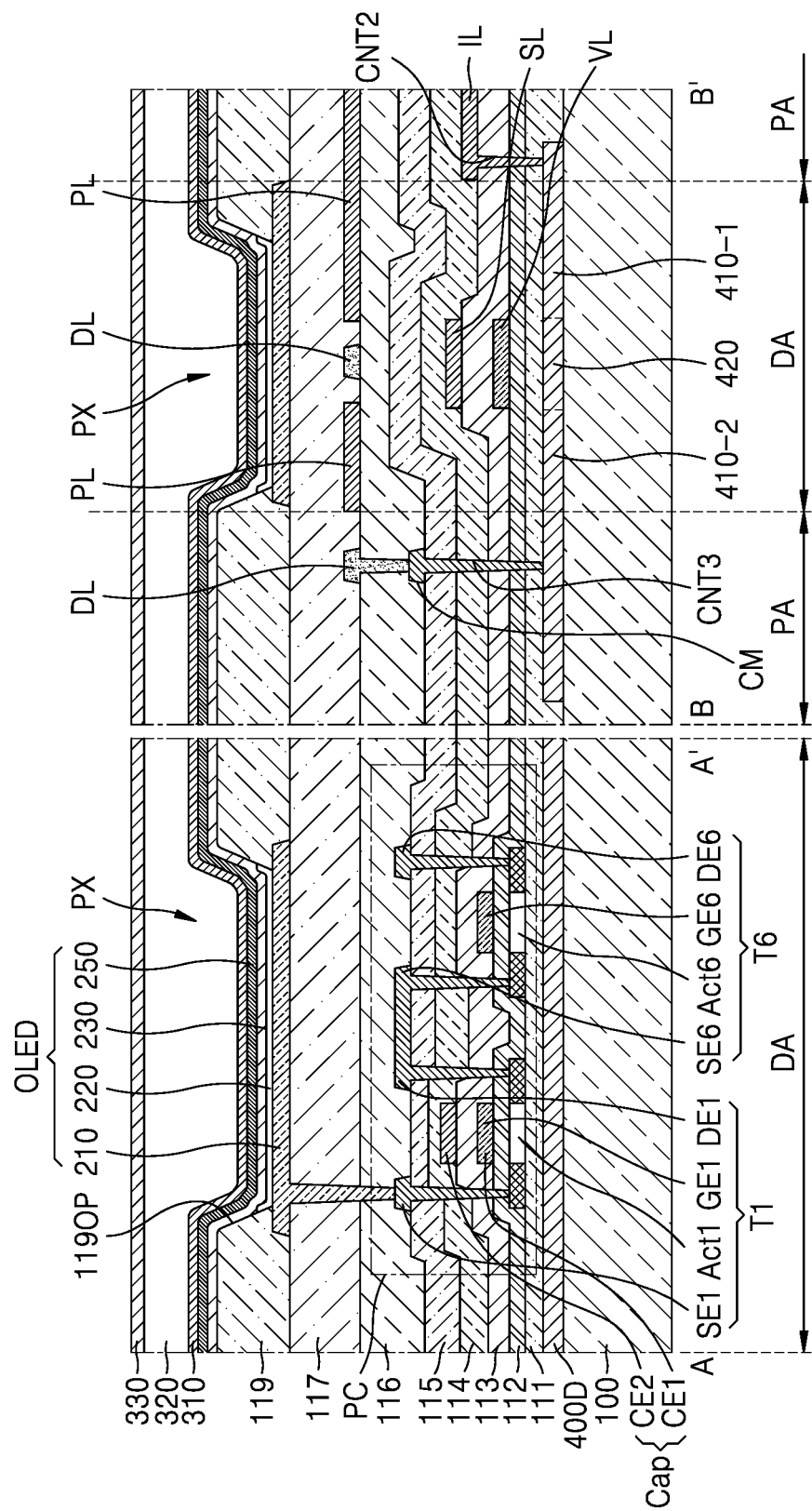
FIG. 5 is a cross-sectional view partially showing a display device according to some example embodiments.

FIG. 5 is a cross-sectional view partially showing a display apparatus according to some example embodiments. FIG. 5 may correspond to a cross-section of the display apparatus taken along the line A-A' of FIG. 1 and line B-B' of FIG. 4B.

Referring to the portion A-A' of FIG. 5, the substrate 100 may include a glass material mainly containing $SiO_2$ or a polymer resin. The polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, etc. The substrate 100 including the polymer resin may be flexible, rollable, or bendable. The substrate 100 may have a multi-layered structure including a layer including the polymer resin stated above and an inorganic layer.

A buffer layer 111 may be on the substrate 100. The buffer layer 111 may reduce or prevent infiltration of impurities, moisture, external air, or other contaminants from below the substrate 100, and may provide a planarized surface on the substrate 100. The buffer layer 111 may include an inorganic insulating material such as silicon oxide, silicon oxynitride, and silicon nitride, and may have a single-layered or multi-layered structure including the stated materials.

The pixel circuit PC may be on the buffer layer 111. The pixel circuit PC may include the thin film transistors TFT and the storage capacitor Cap. As described above with reference to FIG. 3, the pixel circuit PC may include seven thin film transistors T1 to T7, but FIG. 5 shows cross-sections of the driving thin film transistor T1 and the emission control thin film transistor T6 from among the thin film transistors T1 to T7. Hereinafter, a stack structure of the pixel circuit PC will be described with reference to the driving thin film transistor T1 and the emission control thin film transistor T6 for convenience of description.

The driving thin film transistor T1 and the emission control thin film transistor T6 may be on the buffer layer 111. The driving thin film transistor T1 may include a semiconductor layer Act1, a gate electrode GE1, a source electrode SE1, and a drain electrode DE1. The emission control thin film transistor T6 may include a semiconductor layer Act6, a gate electrode GE6, a source electrode SE6, and a drain electrode DE6.

The semiconductor layer Act1 of the driving thin film transistor T1 and the semiconductor layer Act6 of the emission control thin film transistor T6 may each include amorphous silicon, polycrystalline silicon, or an organic semiconductor material. According to some example embodiments, the semiconductor layers Act1 and Act6 may each include an oxide of at least one selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). Each of the semiconductor layers Act1 and Act6 may include a source region and a drain region doped with impurities, and a channel region between the source region and the drain region.

The gate electrode GE1 of the driving thin film transistor T1 and the gate electrode GE6 of the emission control thin film transistor T6 may be respectively on the semiconductor layer Act1 of the driving thin film transistor T1 and the semiconductor layer Act6 of the emission control thin film transistor T6. According to some example embodiments, a first gate insulating layer 112 may be between the semiconductor layers Act1 and Act6 and the gate electrodes GE1 and GE6. The gate electrodes GE1 and GE6 may respectively overlap the channel regions of the semiconductor layers Act1 and Act6. The gate electrodes GE1 and GE6 may each have a single-layered or multi-layered structure including a low-resistive conductive material such as molybdenum (Mo), aluminum (Al), copper (Cu), and/or titanium (Ti).

The source electrode SE1 and the drain electrode DE1 of the driving thin film transistor T1 and the source electrode SE6 and the drain electrode DE6 of the emission control thin film transistor T6 may be above the semiconductor layers Act1 and Act6 such that the first gate insulating layer 112, a second gate insulating layer 113, a third gate insulating layer 114, and an interlayer insulating layer 115 may be therebetween. The source electrodes SE1 and SE6 may be respectively connected to the source regions of the semiconductor layers Act1 and Act6 via contact holes in the first gate insulating layer 112, the second gate insulating layer 113, the third gate insulating layer 114, and the interlayer insulating layer 115, and the drain electrodes DE1 and DE6 may be respectively connected to the drain regions of the semiconductor layers Act1 and Act6 via the contact holes in the first gate insulating layer 112, the second gate insulating layer 113, the third gate insulating layer 114, and the interlayer insulating layer 115. The source electrode SE1 or the drain electrode DE1 of the driving thin film transistor T1 may be connected to the source electrode SE6 or the drain electrode DE6 of the emission control thin film transistor T6.

The source electrodes SE1 and SE6 or the drain electrodes DE1 and DE6 may each have a single-layered or multi-layered structure including aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and/or copper (Cu). For example, the source electrodes SE1 and SE6 or the drain electrodes DE1 and DE6 may each have a triple-layered structure including titanium layer/aluminum layer/titanium layer.

The storage capacitor Cap may overlap the driving thin film transistor T1. The storage capacitor Cap may include a first capacitor plate CE1 and a second capacitor plate CE2 overlapping each other. According to some example embodiments, the gate electrode GE1 of the driving thin film transistor T1 may include the first capacitor plate CE1 of the storage capacitor Cap. The second gate insulating layer 113 may be between the first capacitor plate CE1 and the second capacitor plate CE2. According to some example embodiments, the storage capacitor Cap may not overlap the driving thin film transistor T1, and the first capacitor plate CE1 of the storage capacitor Cap may be an element independent from the gate electrode GE1 of the driving thin film transistor T1.

The first capacitor plate CE1 may have the same material as that of the gate electrodes GE1 and GE6. The second capacitor plate CE2 may have a single-layered or multi-layered structure including aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and/or copper (Cu).

The first gate insulating layer 112, the second gate insulating layer 113, the third gate insulating layer 114, and the interlayer insulating layer 115 may each have a single-layered or multi-layered structure including an inorganic insulating material such as silicon oxide, silicon oxynitride, and silicon nitride.

In addition, according to some example embodiments, gate electrodes in some of the thin film transistors TFT may be on the third gate insulating layer 114 for integrating the pixel circuit, and the gate electrodes may have a single-layered or multi-layered structure including a low-resistive conductive material such as molybdenum (Mo), aluminum (Al), copper (Cu), and/or titanium (Ti).

A first planarization layer 116 and a second planarization layer 117 may be on the interlayer insulating layer 115. The first and second planarization layers 116 and 117 are on the thin film transistors TFT of the pixel circuit PC to cover the thin film transistors TFT. The first and second planarization layers 116 and 117 may include an organic insulating material such as acryl, benzocyclobutene (BCB), polyimide, hexamethyldisiloxane (HMDSO), etc. The organic insulating material of the first and second planarization layers 116 and 117 may be a photosensitive organic insulating material.

A pixel electrode 210 may be on the first and second planarization layers 116 and 117. The pixel electrode 210 may be electrically connected to the pixel circuit PC via a contact hole in the first and second planarization layers 116 and 117.

The pixel electrode 210 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. The pixel electrode 210 may include a reflective layer including the above-stated material, and a transparent conductive layer on and/or under the reflective layer. The transparent conductive layer may include indium tin oxide (ITO), indium zinc oxide (IZO), zinc oxide (ZnO), indium oxide ($In_2O_3$), indium gallium oxide, or aluminum zinc oxide (AZO). According to some example embodiments, the pixel electrode 210 may have a triple-layered structure including ITO layer/Ag layer/ITO layer that are stacked sequentially.

A pixel defining layer 119 may be on the pixel electrode 210. The pixel defining layer 119 covers edges of the pixel electrode 210 and may include an opening 119OP overlapping a central portion of the pixel electrode 210.

The pixel defining layer 119 increases a distance between an edge of the pixel electrode 210 and the opposite electrode 230 on the pixel electrode 210 to prevent or reduce instances of an arc being generated at the edge of the pixel electrode 210. The pixel defining layer 119 may include an organic insulating material such as polyimide, polyamide, an acrylic resin, benzocyclobutene, HMDSO, and a phenol resin, and may be obtained by a spin coating, etc.

An intermediate layer 220 is on the pixel defining layer 119, the intermediate layer 220 corresponding to the pixel electrode 210. The intermediate layer 220 may include a polymer or low-molecular weight organic material emitting certain color light.

An opposite electrode 230 is on the intermediate layer 220. The opposite electrode 230 may include a conductive material having a relatively low work function. For example, the opposite electrode 230 may include a (semi-)transparent layer including argentum (Ag), magnesium (Mg), aluminum (Al), nickel (Ni), chromium (Cr), lithium (Li), calcium (Ca), or an alloy thereof. Alternatively, the opposite electrode 230 may further include a layer including ITO, IZO, ZnO, or $In_2O_3$ on the (semi-)transparent layer including the above material. According to some example embodiments, the opposite electrode 230 may include argentum (Ag) and magnesium (Mg). The opposite electrode 230 may be integrally provided to entirely cover display areas DA.

A stack structure of the pixel electrode 210, the intermediate layer 220, and the opposite electrode 230 may configure a light-emitting diode, e.g., organic light-emitting diode OLED. The organic light-emitting diode OLED may emit red light, green light, or blue light, and an emission area in each organic light-emitting diode OLED may correspond to the pixel PX. Because the opening 119OP of the pixel defining layer 119 defines a size and/or width of the light-emitting area, the size and/or width of the pixel PX may be dependent upon the size and/or width of the corresponding opening 119OP of the pixel defining layer 119.

A capping layer 250 may be on the opposite electrode 230. The capping layer 250 may include LiF. Alternatively, the capping layer 250 may include an inorganic insulating material such as silicon nitride, and/or an organic insulating material. According to some example embodiments, the capping layer 250 may be omitted.

The thin film encapsulation layer 300 may be on the capping layer 250. The organic light-emitting diode OLED may be covered by the thin film encapsulation layer 300. The thin film encapsulation layer 300 may include first and second inorganic encapsulation layers 310 and 330, and an organic encapsulation layer 320 between the first and second inorganic encapsulation layers 310 and 330.

The first and second inorganic encapsulation layers 310 and 330 may each include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be obtained by a chemical vapor deposition method.

The organic encapsulation layer 320 may include a polymer-based material. The polymer-based material may include an acryl-based resin, an epoxy-based resin, polyimide, polyethylene, etc. For example, the organic encapsulation layer 320 may include an acryl-based resin, e.g., polymethylmethacrylate, polyacrylic acid, etc. The organic encapsulation layer 320 may be obtained by curing a monomer or applying polymer.

An optical functional layer such as a touch input layer, an anti-reflection layer, a color filter layer, etc., and an overcoat layer may be on the thin film encapsulation layer 300.

Next, referring to a portion corresponding to B-B' of FIG. 5, the plurality of connecting lines 400 may be between the substrate 100 and the buffer layer 111. The plurality of connecting lines 400 may be under the thin film transistors TFT and may be between the substrate 100 and the semiconductor layers Act1 and Act6. The plurality of connecting lines 400 may each include a low-resistive conductive material such as aluminum (Al), titanium (Ti), and/or titanium nitride (TiN), for example, may have a single-layered structure including aluminum (Al), a dual-layered structure including aluminum (Al) and titanium (Ti), or a dual-layered structure including aluminum (Al) and titanium nitride (TiN).

Because the plurality of connecting lines 400 include the low-resistive conductive material, an RC delay may be reduced. By reducing a resistance of the plurality of connecting lines 400 for transferring electrical signals such as the data signal, a delay time for driving the pixel circuit may be reduced, and accordingly, a relatively high-speed driving of the pixel circuit may be performed. As such, more pixel circuits may be in the display area DA of the display apparatus 10, and the display apparatus of high resolution may be obtained.

In a comparative example, in a display apparatus having a resolution of 2.5 k, in which a plurality of connecting lines are at the same layer as that of gate electrodes of thin film transistors and include molybdenum (Mo), each of the plurality of connecting lines may have a resistance of 9,813 ohms. On the contrary, according to some example embodiments, in the display apparatus, in which the plurality of connecting lines 400 are under the thin film transistors TFT and each include a dual-layered structure including aluminum (Al) and titanium oxide (TiN) and a resolution of 3 k is provided, each of the connecting lines 400 may have a resistance of 1,796 ohms. According to some example embodiments, the resistance of each of the plurality of connecting lines 400 may be reduced by 81.7% as compared with that of the comparative example, and thus, the RC delay may be largely reduced.

In addition, aluminum (Al) included in the plurality of connecting lines 400 may have a relatively large thermal expansion coefficient, and thus, the plurality of connecting lines 400 may thermally expand and the inorganic layer covering the plurality of connecting lines 400 may explode during the manufacturing processes of the display apparatus. To prevent or reduce such occurrences, according to some example embodiments, the plurality of connecting lines 400 may each have a dual-layered structure including titanium (Ti) or titanium nitride (TiN).

The initialization voltage line VL may be on the plurality of connecting lines 400. The buffer layer 111 and the first gate insulating layer 112 may be between the plurality of connecting lines 400 and the initialization voltage line VL. That is, the initialization voltage line VL is on the first gate insulating layer 112, and may be at the same layer as that of the gate electrodes GE1 and GE6. The initialization voltage line VL may overlap the second main bodies 420 in the plurality of connecting lines 400.

The scan line SL may be on the initialization voltage line VL. For example, the scan line SL may be on the second gate insulating layer 113 and/or the third gate insulating layer 114. The initialization voltage line VL may be between the scan line SL and the plurality of connecting lines 400, and may overlap the scan line SL. As described above, the initialization voltage line VL may shield the scan line SL and the plurality of connecting lines 400 from each other. The scan line SL and the connecting line 400 may be configured to respectively transfer the scan signal and the data signal, and a parasitic capacitance occurring between the scan line SL and the connecting line 400 may adversely affect the displaying quality of the display apparatus 10. However, according to some example embodiments, the initialization voltage line VL, to which the constant voltage is applied, shields the scan line SL and the connecting line 400 against each other, and thus, the parasitic capacitance and coupling effects caused due to the parasitic capacitance may be reduced and the display quality may be improved.

The plurality of input lines IL may be on, for example, the first gate insulating layer 112, and may include the same material as that of the gate electrodes GE1 and GE6. In this case, the plurality of input lines IL may be respectively connected to the plurality of connecting lines 400 via the second contact holes CNT2 in the first gate insulating layer 112 and the buffer layer 111. In another example, the plurality of input lines IL may be on the second gate insulating layer 113, and may have the same material as that of the second capacitor plate CE2 of the storage capacitor Cap. In this case, the plurality of input lines IL may be respectively connected to the plurality of connecting lines 400 via the second contact holes CNT2 in the first and second gate insulating layers 112 and 113 and the buffer layer 111. As such, the plurality of input lines IL may apply the data signal to the plurality of connecting lines 400.

The data lines DL and the driving voltage lines PL may be on the first planarization layer 116. The data lines DL may be respectively connected to the plurality of connecting lines 400 via the third contact hole CNT3 in the first planarization layer 116, the interlayer insulating layer 115, the first to third gate insulating layers 112, 113, and 114, and the buffer layer 111. As such, the data lines DL may receive the data signals from the plurality of connecting lines 400. The driving voltage line PL may overlap a part in each of the plurality of connecting lines 400, for example, may overlap the first main body 410 in each of the plurality of connecting lines 400.

In a comparative example, when the plurality of connecting lines 400 are on the first planarization layer 116, a second planarization layer 117 may be only between the plurality of connecting lines 400 and the pixel electrode 210. Hereinafter, as described with reference to FIG. 6A, a gap GP may be between two connecting lines adjacent to each other from among the plurality of connecting lines 400. Due to the gap GP, concavo-convex patterns may be generated on an upper surface of the second planarization layer 117, and when the gap GP overlaps the pixel electrode 210, the pixel electrode 210 may not be flat. Therefore, there may be a variation in a reflective characteristic of the external light from the pixel electrode 210, which may adversely affect the display quality.

However, according to some example embodiments, as shown in FIG. 5, the buffer layer 111, the first to third gate insulating layers 112, 113, and 114, the interlayer insulating layer 115, the first planarization layer 116, and the second planarization layer 117 may be between the plurality of connecting lines 400 and the pixel electrode 210. Because there are sufficient insulating layers on the plurality of connecting lines 400, the second planarization layer 117 may have a flat upper surface even when the gap GP is between two adjacent connecting lines 400. Therefore, the pixel electrode 210 may be provided flat, and degradation in the display quality may be prevented or reduced.

Figure 6A:
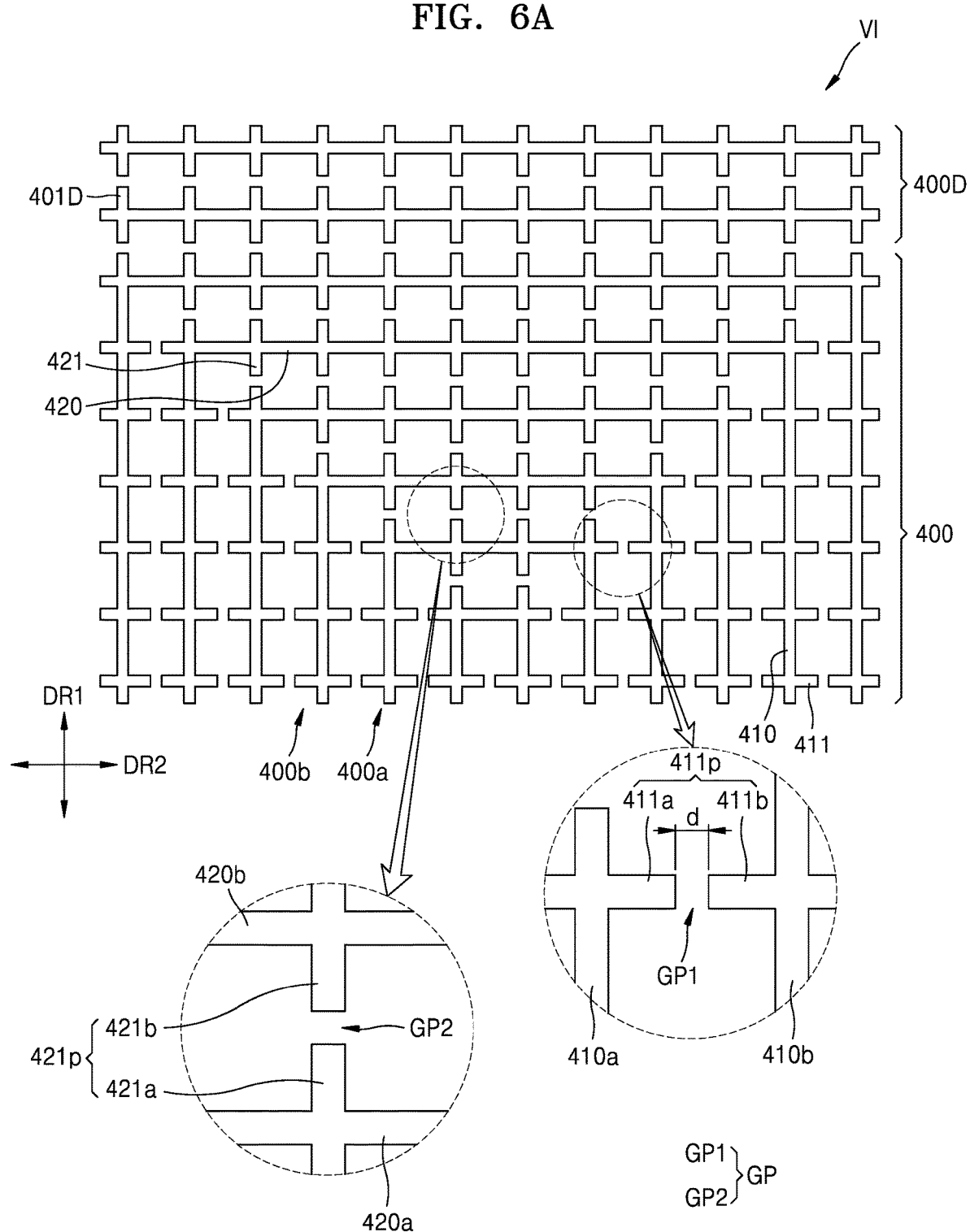
FIGS. 6A and 6B are plan views showing some components in a display apparatus according to some example embodiments.
Figure 6B:
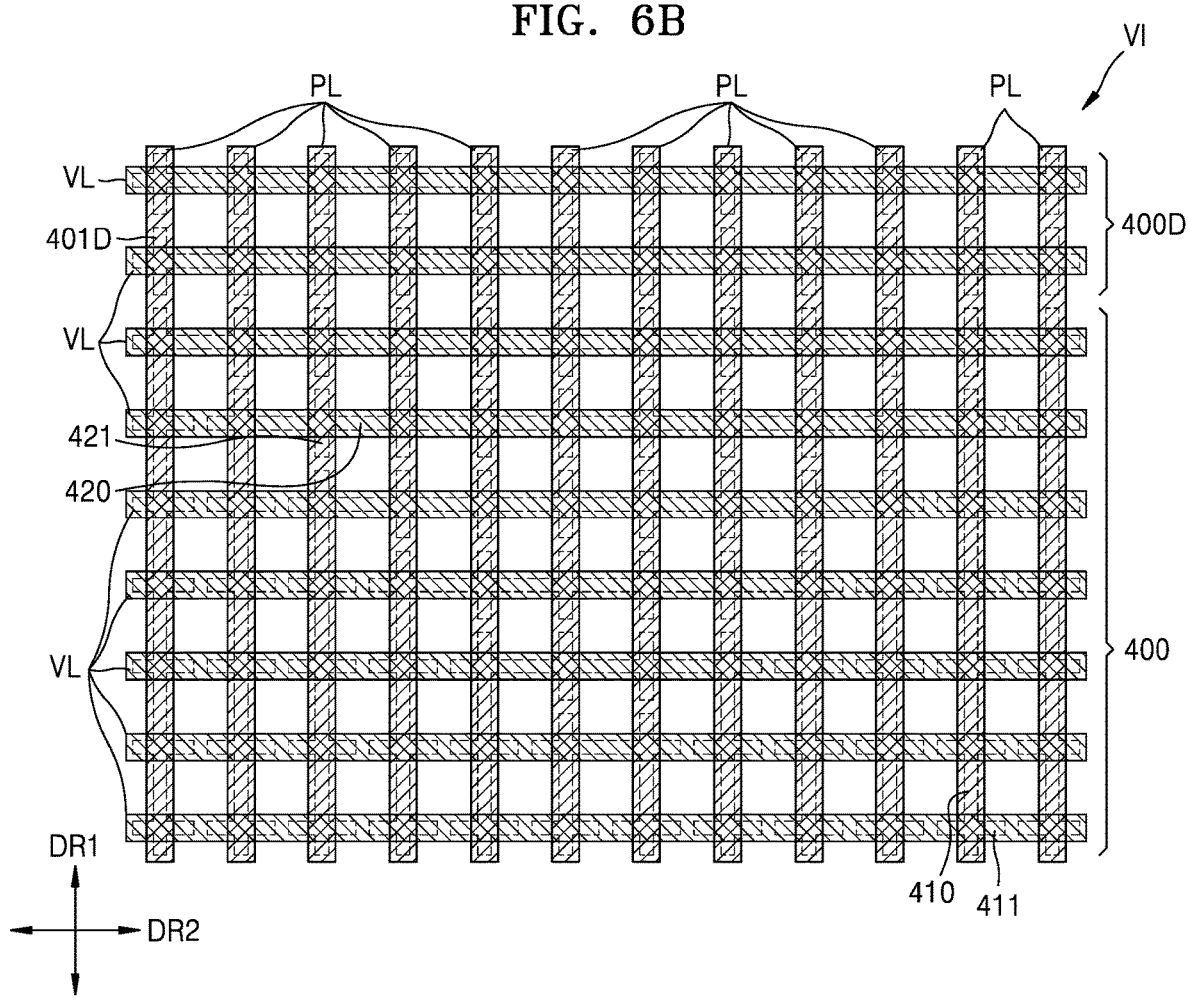

FIGS. 6A and 6B are plan views showing some components in a display apparatus according to some example embodiments, and may correspond to a region VI of FIG. 2. FIG. 6A shows arrangement of the plurality of connecting lines, and FIG. 6B shows arrangement of the plurality of connecting lines, the driving voltage lines, and the initialization voltage lines.

Referring to FIG. 6A, each of the plurality of connecting lines 400 may include first branch portions 411 extending from the first main bodies 410 in the second direction DR2 and second branch portions 421 extending from the second main bodies 420.

The first and second branch portions 411 and 421 may each extend symmetrically based on the first and second main bodies 410 and 420. For example, the first branch portions 411 may extend from the first main bodies 410 towards opposite sides in a direction (e.g., a second direction) perpendicular to a direction (e.g., a first direction) in which the first main bodies 410 extend. Also, the second branch portions 421 may extend from the second main bodies 420 towards opposite sides in a direction (e.g., a first direction) perpendicular to a direction (e.g., a second direction) in which the second main bodies 420 extend.

When the plurality of connecting lines 400 do not include the first and second branch portions 411 and 421, the plurality of connecting lines 400 may only extend in the first direction DR1 in the first region AR1 (see, e.g., FIG. 1) and may only extend in the second direction DR2 in the second region AR2 (see, e.g., FIG. 2), and thus, patterns of the plurality of connecting lines 400 in the first region AR1 and the second region AR2 may be largely different from each other. Therefore, the difference between the light reflecting characteristics of the first and second regions AR1 and AR2 may increase, and thus, the plurality of connecting lines 400 may be recognized by the user.

However, according to some example embodiments, the plurality of connecting lines 400 include the first branch portions 411 and the second branch portions 421, the plurality of connecting lines 400 in the first region AR1 (see, e.g., FIG. 1) and the second region AR2 (see, e.g., FIG. 2) may have similar patterns from each other. As such, the difference between the external light reflecting characteristics of the first region AR1 and the second region AR2 may be reduced. Therefore, visibility of the plurality of connecting lines 400 by users may be prevented or reduced, and the visibility of and perception of the distinction between the first and second regions AR1 and AR2 may be prevented or reduced.

In addition, a pair of branch portions facing each other may be between two adjacent connecting lines 400 from among the plurality of connecting lines 400. The pair of branch portions may be apart a certain distance from each other with the gap GP therebetween. Regarding this, a first connecting line 400a and a second connecting line 400b that are adjacent to each other from among the plurality of connecting lines 400 will be described below.

The plurality of connecting lines 400 may include the first and second connecting lines 400a and 400b adjacent to each other. The first connecting line 400a may include a first main body 410a, first branch portions 411a extending from the first main body 410a in the second direction DR2, a second main body 420a connected to the first main body 410a and extending in the second direction DR2, and second branch portions 421a extending from the second main body 420a in the first direction DR1. Similarly, the second connecting line 400b may include a first main body 410b, first branch portions 411b extending from the first main body 410b in the second direction DR2, a second main body 420b connected to the first main body 410b and extending in the second direction DR2, and second branch portions 421b extending from the second main body 420b in the first direction DR1.

Each of the first branch portions 411a of the first connecting line 400a and each of the first branch portions 411b of the second connecting line 400b may configure a pair of first branch portions 411p. Each of the first branch portions 411a in the first connecting line 400a and each of the first branch portions 411b in the second connecting line 400b face each other and extend towards each other, and may be separated from each other with a distance d therebetween. As such, a plurality of first gaps GP1 may be between corresponding pairs of the first branch portions 411a of the first connecting line 400a and the first branch portions 411b of the second connecting line 400b. Similarly, each of the second branch portions 421a in the first connecting line 400a and each of the second branch portions 421b in the second connecting line 400b face each other and extend towards each other, and may be separated from each other with a certain distance therebetween. As such, a plurality of second gaps GP2 may be between corresponding pairs of the second branch portions 421a of the first connecting line 400a and the second branch portions 421b of the second connecting line 400b.

Because the plurality of connecting lines 400 are configured to transfer different data signals from one another, the branch portions between the adjacent connecting lines 400 in the plurality of connecting lines 400 are separated from each other so as not to be short-circuited. That is, because the first connecting line 400a is configured to transfer the data signal to one of the plurality of data lines DL and the second connecting line 400b is configured to transfer a different data signal to one another of the plurality of data lines DL, the first connecting line 400a and the second connecting line may be separated from each other with the first gap GP1 and the second gap GP2 therebetween.

In addition, the dummy connecting lines 400D may be in the third region AR3 (see, e.g., FIG. 2), and the dummy connecting lines 400D may include dummy branch portions 401D that are similar to the second branch portions 421. As such, any visible distinction between the third region AR3 and the first and second regions AR1 and AR2 that is perceptible by viewers may be prevented or reduced.

Referring to FIG. 6B, when the plurality of connecting lines 400 include the first branch portions 411 and the second branch portions 421, the driving voltage lines PL may overlap the second branch portions 421 extending in the first direction DR1, and the initialization voltage lines VL may overlap the first branch portions 411 extending in the second direction DR2. As such, due to the first and second branch portions 411 and 421 of the plurality of connecting lines 400 and the first and second gaps GP1 and GP2 between the plurality of connecting lines 400, the patterns of the plurality of connecting lines 400 may be prevented from being recognized by the user.

Figure 7:
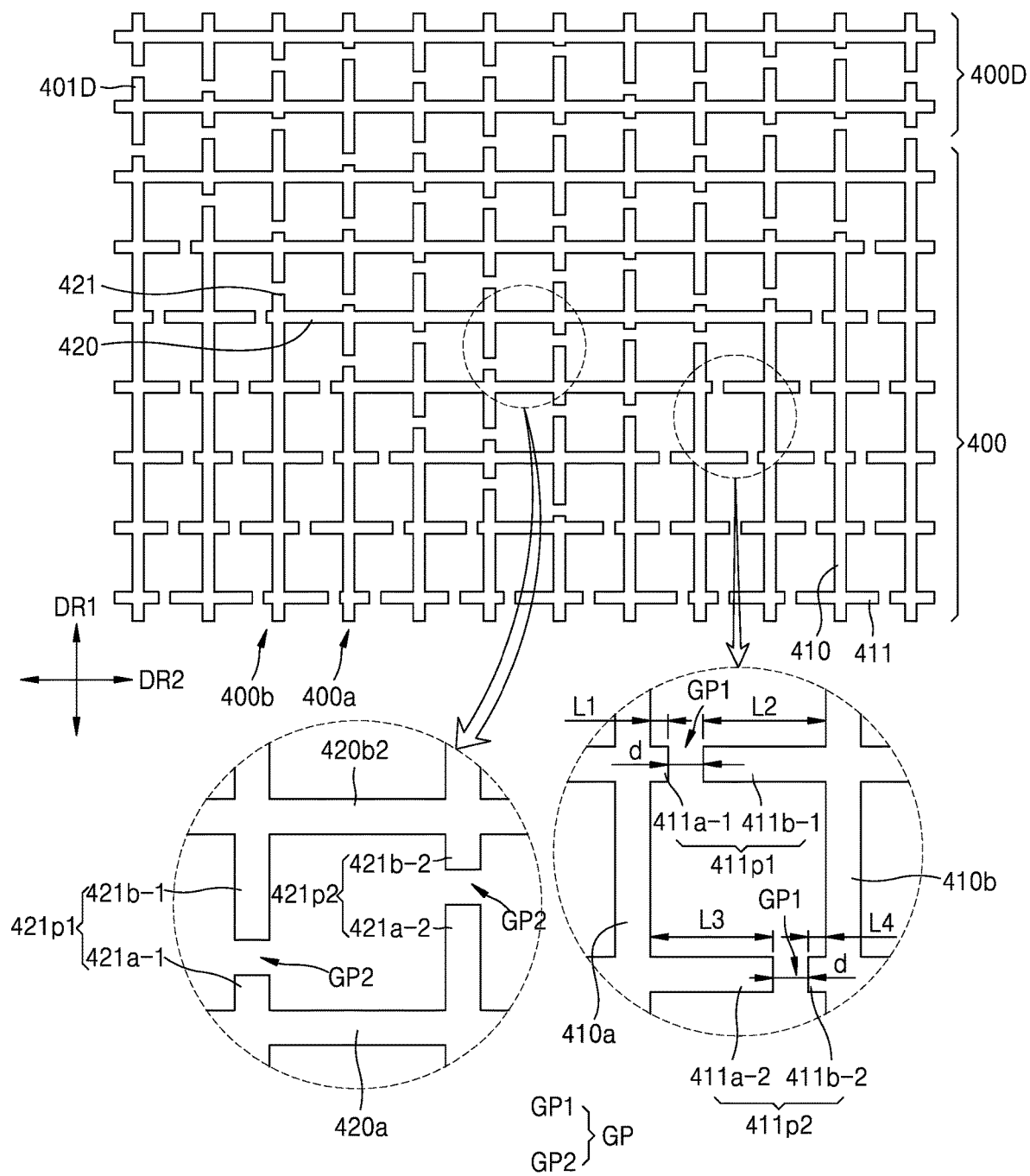
FIG. 7 is a plan view showing some components in a display apparatus according to some example embodiments.

FIG. 7 is a plan view showing some components in a display apparatus according to some example embodiments. Descriptions about components that are the same as or similar to those described above with reference to FIGS. 6A and 6B will be omitted, and differences will be described below.

Referring to FIG. 7, locations of the first and second gaps GP1 and GP2 between the plurality of connecting lines 400 may be dependent upon extension lengths of the branch portions that generate the first and second gaps GP1 and GP2. Therefore, the locations of the first and second gaps GP1 and GP2 may be changed by varying the extension lengths of the branch portions. Regarding this, the first connecting line 400a and the second connecting line 400b that are adjacent to each other from among the plurality of connecting lines 400 will be described below.

First branch portions 411a-1 and 411a-2 extending from the first main body 410a of the first connecting line 400a may respectively correspond to first branch portions 411b-1 and 411b-2 extending from the first main body 410b of the second connecting line 400b. The first branch portions 411a-1 and 411a-2 of the first connecting line 400a and the first branch portions 411b-1 and 411b-2 of the second connecting line 400b may be respectively provided as a first pair of first branch portions 411p1 and a second pair of first branch portions 411p2.

For example, when an extension length L1 of one first branch portion 411a-1 among the first pair of first branch portions 411p1 is reduced, an extension length L2 of another first branch portion 411b-1 may be increased. In this case, the first gap GP1 between the first pair of first branch portions 411p1 may be closer to the first main body 410a that is connected to the first branch 411a-1 than to the first main body 410b connected to the first branch portion 411b-1.

Similarly, second branch portions 421a-1 and 421a-2 extending from the second main body 420a of the first connecting line 400a may respectively correspond to second branch portions 421b-1 and 421b-2 extending from the second main body 420b of the second connecting line 400b. The second branch portions 421a-1 and 421a-2 of the first connecting line 400a and the second branch portions 421b-1 and 421b-2 of the second connecting line 400b may be respectively provided as a first pair of second branch portions 421p1 and a second pair of second branch portions 421p2.

For example, when an extension length of one of the second branch portion 421a-1 among the first pair of second branch portions 421p1 is reduced, an extension length of another second branch portion 421b-1 may be increased. In this case, the second gap GP2 may be closer to the second main body 420a connected to the second branch portion 421a-1 than to the second main body 420b connected to the second branch portion 421b-1.

Extension lengths of the first branch portions 411 may be different from one another. For example, the extension length L1 of one first branch portion 411a-1 from among the first branch portions of the first main body 410a in the first connecting line 400a may be different from an extension length L3 of another first branch portion 411a-2. In addition, extension lengths of the first branch portions 411b-1 and 411b-2 of the first main body 410b in the second connecting line 400b may be different from each other.

Similarly, extension lengths of the second branch portions 421 may be different from one another. From among the second branch portions of the second main body 420a in the first connecting line 400a, one second branch portion 421a-1 and another second branch portion 421a-2 may have different extension lengths.

The extension lengths of the first and second branch portions 411 and 421 may be randomly determined, and locations of the first and second branch portions 411 and 421 having different extension lengths may be randomly determined. As such, the locations of the gaps GP between the plurality of connecting lines 400 may be random.

When the gaps GP are distributed regularly, the gaps GP may be applied as patterns recognized by the user. Therefore, the first and second branch portions 411 and 421 have different extension lengths from each other and are arranged randomly, and thus, the gaps GP may be arranged randomly. As such, external light visibility may be further improved.

The display apparatus has been described, but embodiments according to the present disclosure are not limited thereto. For example, a method of manufacturing the display apparatus may be also included in the scope of the disclosure.

According to one or more embodiments, the display apparatus, in which an area of the dead space may be reduced and the lines patterned in the display area may be prevented from being recognized from outside the display apparatus, may be provided. Also, the parasitic capacitance that may occur among the lines for transferring electrical signals and the coupling effect caused by the parasitic capacitance may be reduced to improve the display quality, and the high speed driving of the display apparatus may be performed and the display apparatus may have high resolution. However, the scope of embodiments according to the present disclosure is not limited to the above characteristics.

While the disclosure has been particularly shown and described with reference to example embodiments thereof, it will be understood by those of ordinary skill in the art that various changes in form and details may be made therein without departing from the spirit and scope as defined by the following claims. Therefore, the scope sought to be protected of the disclosure shall be defined by the appended claims and their equivalents.

What is claimed is:

1. A display apparatus including a display area and a peripheral area outside of the display area, the display apparatus comprising:
 a substrate;
 a thin film transistor on the substrate and comprising a semiconductor layer and a gate electrode overlapping at least a portion of the semiconductor layer;
 a plurality of data lines in the display area and extending in a first direction;
 a plurality of input lines in the peripheral area;
 a plurality of connecting lines in the display area that electrically connect the plurality of data lines to the plurality of input lines;
 a power voltage line on the substrate and extending in the first direction; and
 an initialization voltage line on the substrate and extending in a second direction intersecting the first direction,
 wherein a part of each of the plurality of connecting lines overlaps the power voltage line and the initialization voltage line,
 wherein each of the plurality of connecting lines comprises:
 a first main body extending in the first direction and overlapping the power voltage line; and
 a second main body extending in the second direction and overlapping the initialization voltage line.

2. The display apparatus of claim 1, wherein the plurality of connecting lines are between the substrate and the semiconductor layer.

3. The display apparatus of claim 1, wherein each of the plurality of connecting lines further comprises:
 a plurality of first branch portions extending from the first main body in the second direction; and
 a plurality of second branch portions extending from the second main body in the first direction.

4. The display apparatus of claim 3, wherein the first branch portions overlap the initialization voltage line, and the second branch portions overlap the power voltage line.

5. The display apparatus of claim 3, wherein a first one of the first branch portions has an extension length that is different from an extension length of a second one of the first branch portions, and
 a first one of the second branch portions has an extension length that is different from an extension length of a second one of the second branch portions.

6. The display apparatus of claim 1, wherein the plurality of connecting lines comprise a first connecting line and a second connecting line that are adjacent to each other,
 each of the first connecting line and the second connecting line comprises:
 a first main body extending in the first direction;
 a plurality of first branch portions extending from the first main body in the second direction;
 a second main body connected to the first main body and extending in the second direction; and
 a plurality of second branch portions extending from the second main body in the first direction,
 the first branch portions of the first connecting line and the first branch portions of the second connecting line respectively face each other and are separated from each other with a plurality of first gaps therebetween, and
 the second branch portions of the first connecting line and the second branch portions of the second connecting line respectively face each other and are separated from each other with a plurality of second gaps therebetween.

7. The display apparatus of claim 6, wherein the plurality of first gaps and the plurality of second gaps are randomly provided between the first connecting line and the second connecting line.

8. The display apparatus of claim 1, wherein the plurality of data lines and the plurality of connecting lines are at different layers from each other.

9. The display apparatus of claim 1, wherein the initialization voltage line is on a same layer as the gate electrode.

10. The display apparatus of claim 1, further comprising an insulating layer covering the thin film transistor,
 wherein the power voltage line is on the insulating layer.

11. The display apparatus of claim 1, wherein the plurality of connecting lines include at least one of aluminum (Al), titanium (Ti), or titanium nitride (TiN).

12. A display apparatus including a display area and a peripheral area outside of the display area, the display apparatus comprising:
 a substrate;
 a plurality of data lines on the substrate in the display area and extending in a first direction;
 a pad portion in the peripheral area and configured to provide electrical signals;
 a plurality of input lines in the peripheral area and electrically connected to the pad portion;
 a plurality of connecting lines in the display area and electrically connecting the plurality of data lines to the plurality of input lines;
 a first voltage line on the substrate and extending in the first direction; and
 a second voltage line on the substrate and extending in a second direction intersecting the first direction,
 wherein a part of each of the plurality of connecting lines overlaps the first voltage line and the second voltage line,
 wherein each of the plurality of connecting lines further comprises:

a first main body extending in the first direction and overlapping the first voltage line; and a second main body extending in the second direction and overlapping the second voltage line.

13. The display apparatus of claim 12, further comprising a thin film transistor on the substrate and comprising a semiconductor layer and a gate electrode overlapping at least a portion of the semiconductor layer, wherein the plurality of connecting lines are between the substrate and the semiconductor layer.

14. The display apparatus of claim 12, wherein each of the plurality of connecting lines further comprises:

a plurality of first branch portions extending from the first main body in the second direction; and a plurality of second branch portions extending from the second main body in the first direction.

15. The display apparatus of claim 14, wherein the first branch portions overlap the second voltage line, and the second branch portions overlap the first voltage line.

16. The display apparatus of claim 12, wherein the plurality of connecting lines comprise a first connecting line and a second connecting line that are adjacent to each other, each of the first connecting line and the second connecting line comprises:

a first main body extending in the first direction;

a plurality of first branch portions extending from the first main body in the second direction;

a second main body connected to the first main body and extending in the second direction; and a plurality of second branch portions extending from the second main body in the first direction, the first branch portions of the first connecting line and the first branch portions of the second connecting line respectively face each other and are separated from each other with a plurality of first gaps therebetween, and the second branch portions of the first connecting line and the second branch portions of the second connecting line respectively face each other and are separated from each other with a plurality of second gaps therebetween.

17. The display apparatus of claim 16, wherein the plurality of first gaps and the plurality of second gaps are randomly provided between the first connecting line and the second connecting line.

18. The display apparatus of claim 12, wherein the plurality of connecting lines include at least one of aluminum (Al), titanium (Ti), or titanium nitride (TiN).

\* \* \* \* \*